United States Patent
Lee et al.

(10) Patent No.: US 6,902,716 B2
(45) Date of Patent: Jun. 7, 2005

(54) FABRICATION OF SINGLE CRYSTAL DIAMOND TIPS AND THEIR ARRAYS

(75) Inventors: Shuit-Tong Lee, Hong Kong (HK); Igor Bello, Hong Kong (HK); Wenjun Zhang, Hong Kong (HK); Chit Yiu Chan, Hong Kong (HK)

(73) Assignee: City University of Hong Kong, Kowloon (HK)

(*) Notice: Subject to any disclaimer, the term of this patent is extended or adjusted under 35 U.S.C. 154(b) by 28 days.

(21) Appl. No.: 10/282,779

(22) Filed: Oct. 29, 2002

(65) Prior Publication Data

US 2004/0079280 A1 Apr. 29, 2004

(51) Int. Cl.$^7$ .................................. B01J 3/06; B01J 3/08
(52) U.S. Cl. ........................... 423/446; 117/68; 117/89; 117/90; 117/94; 117/95; 117/97
(58) Field of Search .............................. 117/89, 90, 94, 117/95, 97, 68; 423/446

(56) References Cited

PUBLICATIONS

Ph. Niedermann and W. Hanni, N. Blanc, R. Christoph and J. Burger, "Chemical vapor deposition diamond for tips in nanoprobe experiments" J Vac Sci. Technol A14(3), May/Jun. 1996, pp. 1233–1236.

J. E. Field, "The Properties of Natural and Symbetic Diamond", Academic Press Limited, pp. 667–687.

S. Yugo, T. Kanai, T. Kimura and T. Muto, "Generation of diamond nuclei by electric field in plasma chemical vapor deposition", App. Phys. Lett., vol. 58, No. 10, Mar. 11, 1991, pp. 1036–1038.

Seiichiro Matsumoto, Yoichiro Sato, Masayuki Tsutsumi, Nobuo Setaka, "Growth of diamond particles from methane—hydrogen gas", Journal of Materials Science 17 (1982), pp. 3106–3112.

C. Wild. R. Kohl, N. Herre, W. Muller–Sebert and P. Koidl, "Oriented CDV diamond films: twin formation structure and morphology", Diamond and Related Materials, 3 (1994) pp. 373–381.

T. Trenkler et al., "Evaluating probes for "electrical" atomic force microscopy", J. Vac. Sci. Technol. B. vol. 18, No. 1, Jan./Feb. 2000, pp. 418–427.

Ph Niedermann et al., "CVD diamond probes for nanotechnology", Appl. Phys. A 66.S31–S34 (1998).

W.F. Wei and W.J. Leivo, "Photoelectric Emission and Work Function of Semiconducting Diamonds", Carbon, 1975, vol. 13, pp. 425–427.

*Primary Examiner*—Felisa Hiteshew
(74) *Attorney, Agent, or Firm*—Bose McKinney & Evans LLP

(57) ABSTRACT

The present invention deals with the generation of sharp single crystal diamond tips and the arrays of these tips, and their fabrication technology. The invention combines the deposition of synthetic diamond films with reactive etching processes. Upon the diamond orientation prepared and reactive etching environment with considerable directivity of ions, single crystal diamond tips with different apical angles can be fabricated. Very sharp diamond tips with an apical angle of no more than about 28° and a tip radius smaller than 50 nm are fabricated on pyramidal-shaped [001]-textured diamond films by subsequent reactive etching., The technology is based on selective etching of $sp^2$- and $sp^3$-hybridized carbons by the activated constituents of an etching environment, in particular based on atomic hydrogen, in a way similar to ion bombardment, which contributes to overall etching and local conversion of diamond to graphitic phase promoting further etching with chemically activated species. This novel method is capable of forming diamond tip arrays over large areas with great uniformity and high reproducibility. The diamond tips prepared are single diamond crystals with their [001] axes parallel each other and normal to the substrate surface. The invented technology enables the control of the apical angle, radius and density of the diamond tips.

29 Claims, 6 Drawing Sheets

FABRICATION OF SINGLE CRYSTAL DIAMOND TIPS AND THEIR ARRAYS

FIELD OF THE INVENTION

This invention relates to a novel type of single crystal diamond tip, their arrays and methods for their manufacture. In particular, though not exclusively, the present invention relates to single crystal diamond tips which have great potential in probe testing instrument techniques including scanning probe microscopy (SPM) and nanoindentation, nanomechanics and nanomachining in the progressing microelectromechanical systems (MEMS) devices industries and field emission applications.

BACKGROUND OF THE INVENTION

Diamond is an exceptionally useful functional material due to its rare combination of unique physical and chemical properties. Among them are the highest hardness, highest thermal conductivity, high Young's modulus, outstanding chemical inertness, semiconducting wide band gap property, and negative electron affinity which profit its use in both mechanical and electronic applications including field emitting devices [J. E. Field *"The properties of natural and synthetic diamond"* Academic Press; London, 1992]. Diamond can be synthesized in bulk crystalline forms using a high-pressure and high-temperature method and in film forms employing chemical vapor deposition (CVD) in most cases based on hydrogen environment (including plasma) with a carbon precursor [S. Matsumoto, et al., J. Mat. Sci., vol. 17, pps. 3106–3112, "Growth of Diamond particles from methane-hydrogen gas", 1982]. Highly oriented diamond films have been available and prepared on various substrates using bias-enhanced nucleation (BEN) on mirror-polished substrates [S. Yugo, et al., Appl. Phys. Lett., vol. 58, pps. 1036–1038, "Generation of diamond nuclei by electric-field in plasma chemical vapor-deposition", 1991] or by controlling the growth parameters on pre-scratched substrates [C. WILD, et al., Diamond Relat. Mater., vol. 3, pps. 373–381, "Oriented CVD diamond films—Twin Formation, Structure and Morphology", 1994].

Diamond is of great interest in many experimental methods of analysis and testing such as, for example, scanning probe microscopy (SPM), nanoindentation and other nanoprobe techniques. The extreme hardness, the high Young's modulus, the inherent chemical inertness, and the electrical conductivity obtained through doping make this material particularly attractive. Due to the unavailability of sharp single crystal diamond tips on a nanoscale range, some probing tips of atomic force microscopes (AFM) are constructed from silicon coated by diamond. Such technology enables the preparation of tips with radii of 100 to 200 nm [P. Niedermann, et al., J. Vac. Sci. Technol. A, vol. 14, pps. 1233–1236, "Chemical vapor deposition diamond for tips in nanoprobe experiments", 1996; T. Trenkler, et al. J. Vac. Sci. Technol. B, vol. 18, pps. 418–427, "Evaluating probes for "electrical" atomic force microscopy".] for the best and uneven diamond surfaces.

Such tips with high aspect ratio may have an advantage in improving the image resolution. The large radii of the tips may, however, induce distorted images in some topographical surface environments. In addition, because of the high aspect ratio of silicon tips and silicon properties, such diamond coated silicon tips are easily broken during accidental contact with the surface or during scanning the tip over a surface.

Diamond tips are also made by a so-called moulding technique employing the fabrication of pyramidal pits in silicon by anisotropic etching and subsequently filling them by CVD diamond. The chemical removal of silicon then yields diamond pyramids as small as 20–50 nm [P. Niedermann, et al., Appl. Phys. A, vol. 66: pps. S31–S34, "CVD diamond probes for nanotechnology", 1998]. However, the pyramids are polycrystalline diamond and have a low aspect ratio. During manufacture, the pyramidal pits produced in silicon are often not filled by polycrystalline diamond completely and therefore diamond grains are frequently missing on the tip apexes. Thus, diamond tips, which are made of single crystal diamond with high aspect ratio, smaller tip radius and defined crystal orientation would have intrinsic advantages over polycrystalline diamond pyramidal tips being used in AFM probe applications.

Since diamond has negative electron affinity, there is a potential application of diamond in field emitting devices as discussed by Wei et al [W. F. Wei, et al., Carbon, vol. 13, pps. 425–427, "Photoelectric emission and work function of semiconducting diamond" 1975]. However, the high switch-on electric field of normal CVD diamond has limited diamond in such applications. The formation of high-density sharp tips of diamond would certainly decrease the switch-on electric field and promote its field emission applications. A notable application of high-density diamond tips would be a substitute for the filament emiiter in cathode ray tubes widely used in televisions.

SUMMARY OF THE INVENTION

According to the present invention there is provided a method of fabricating a surface provided with single crystal diamond tips, comprising the steps of:

(a) forming diamond nuclei on a substrate, (b) growing a layer of textured diamond film on said substrate, and (c) etching said textured diamond film.

The diamond nuclei are preferably formed either by bias-enhanced nucleation or by pre-scratching the substrate prior to nucleation. The nuclei are preferably-e formed with a (100) orientation.

The textured diamond film may be grown by any conventional CVD process, and the diamond film is preferably grown with a (001) orientation. Preferably the growth of the film is controlled by controlling the alpha parameter.

The etching of the textured film is preferably carried out by applying a negative-bias with a hydrogen-based plasma. However, etching could be carried out by any chemically reactive environment in synergy with ion bombardment in plasma, or ion beams applied to the diamond films.

If it is desired for the diamond tips to be conductive, then this can be achieved by doping either during formation of the diamond film, or during the etching process. Doping may be carried out by introducing a boron-containing, a sulfur-containing, or a phosphorous-containing gas.

BRIEF DESCRIPTION OF THE DRAWINGS

Some embodiments of the invention will now be described by way of example and with reference to the accompanying drawings, in which.

DETAILED DESCRIPTION OF THE PREFERRED EMBODIMENTS

At least in its preferred forms, the present invention provides a method for forming single crystal diamond tips via multiple steps.

Firstly diamond is nucleated using either bias-enhanced nucleation on a mirror polished non-diamond substrate or enhanced nucleation employing scratching non-diamond substrate by hard powders such as diamond, SiC, $Al_2O_3$ or cBN. Secondly highly oriented diamond films are grown via controlling alpha parameters, i.e., the concentration of carbon precursor in a hydrogen-based deposition environment and the substrate temperature. For extremely sharp single crystal diamond tips the [001]-textured, pyramidal-shaped films are preferred in this intermediate step. Thirdly the textured diamond films are etched in chemically reactive environment in synergy with ion bombardment induced by applying a substrate bias. More details of this process and the resulting diamond tips are described below.

Figure 1:
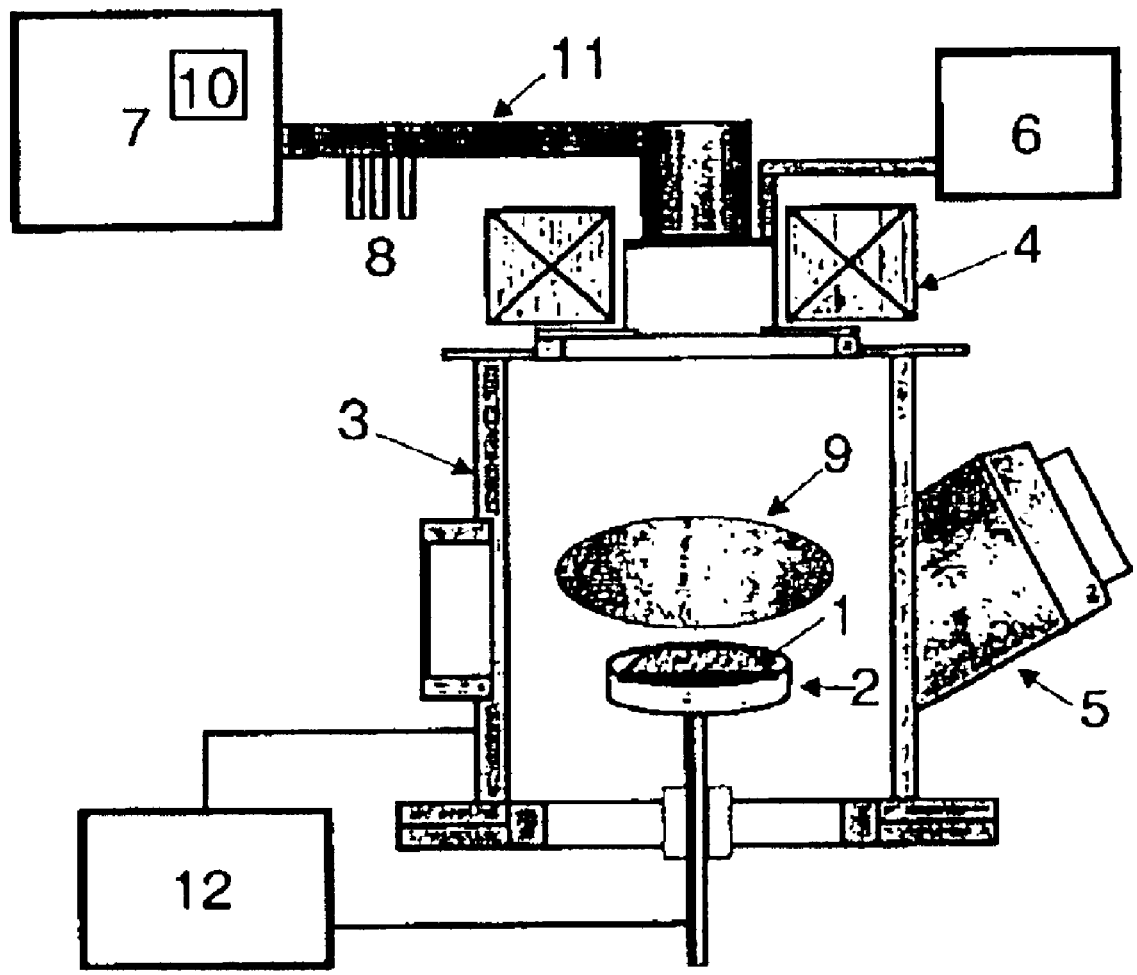
FIG. 1 is a schematic view of apparatus for use in carrying out a method according to an embodiment of this invention.

FIG. 1 shows a schematic diagram of a microwave plasma apparatus employed for fabricating single crystal diamond tips in accordance with an embodiment of this invention. The apparatus includes sample 1, sample holder 2, reaction chamber 3, magnetic coil 4, turbomolecular pump 5, gas supply units 6, 2.45 GHz microwave generator 7, impedance transformer 8, plasma ball 9, powermeter 10, 11—waveguide 11, and biasing power supply 12. When a magnetic field of ~875 G is applied to the central region of the reaction chamber using an external magnetic coil 4 under low pressure conditions, an electron cyclotron resonance (ECR) mode of the system operation can be employed in the fabrication method of single diamond tips.

In preferred embodiments of this invention, a number of the parameters of the fabrication process, such as the choice of substrate, nucleation technique, the method of forming the diamond film, and the final etching process, can all be varied depending on the particular nature of the desired diamond tips. In addition the diamond tips can be made conducting by incorporating boron-doping either into the diamond film formation, or into the etching environment as will be discussed below.

The reactive etching environment is based predominantly on plasma-activated hydrogen. Inert gases such as argon or helium, oxygen, nitrogen and halogen-containing gas (fluorine or chlorine) can be optionally added to the gas phase in order to control the plasma, reaction rate, and phase purity of diamond tips. The optimum flow rates of such reactant gases considerably vary depending on the plasma type, method of plasma generation, gas pressure, and other processing parameters. Other possibilities for the etching process include etching in oxygen-, nitrogen- or argon-based plasmas.

Conductive single crystal diamond tips may be produced by feeding a boron-containing gas into the environment for the deposition of the textured diamond films or into the environment for etching of the diamond films. Boron gas sources include boron hydrides (e.g., diborane and decaborane), boron halides (e.g., boron trichloride and boron triflouride), borohydrides (e.g., sodium borohydride), borofluoride (e.g., ammonium borofluoride or trimethylboride—TMB), or organic boron compounds such as triethoxyboron. The optimum flow rate of such boron containing gas varies in accord with the electrical conductivity of diamond tips required, plasma type, method of plasma generation, gas pressure, and gas composition. The practical range of molecular concentration of boron-containing gases in the plasma gas is from ppm level to tens of percent.

In the preparation of the oriented diamond film, which serves as an intermediate material for the manufacture of single crystal diamond tips, CVD environments including both non-equilibrium (cold plasma) and equilibrium (thermal plasma) being excited by direct current, alternating current, radio-frequency, microwave or other electromagnetic radiations are all possible. Similarly, in the etching step of the fabrication method, the plasma can also be either non-equilibrium (cold) or equilibrium (thermal) plasma driven by direct, low-frequency, alternating current, high-frequency current, and microwaves or other electromagnetic radiations. Depending on the excitation method used, power can be supplied into the plasma via internal electrodes, capacitive and inductive coupling, antenna coupling, resonator coupling, surface-wave excitation or other known methods. As will be seen below, in the case of the example demonstrated below, cold plasma induced by microwave and fed into a reactor via an impedance transformer was employed to deposit [001] oriented textured diamond film. The same system was used for etching the textured films prepared, however, using a different reactive environment in term of composition, total pressure and control parameters including substrate bias and temperature.

The fabrication method of the diamond tips may use a gas phase pressure ranging from $10^{-4}$ to $10^2$ Torr. In the system to be described below, working in an ECR mode, pressure of $10^{-3}$ Torr is recommended to be used for the sake of the high ion-to-neutral ratio and thus high reaction rate, ion directivity and ease of control of the tips formation. However, in the case of a microwave mode operation, a suitable pressure is from 20 to 100 Torr.

In embodiments of the present invention, the deposition of oriented diamond films, serving as intermediate materials for the fabrication of single crystal tips, can be on a variety of non-diamond substrates including semiconductors (e.g., silicon or silicon carbide), insulators (i.e., quartz and sapphire), and metals such (e.g., platinum and iridium). Many different substrates may be used.

Preferably, the surface morphology of the oriented diamond film is controlled via the growth parameters. The growth rate in both the [001] and [111] growth directions is controlled by changing the concentration of carbon precursor in the CVD environment, substrate temperature and other parameters. The [001] textured pyramidal-shaped diamond films are preferable in terms of the high tip uniformity, the reduction of the tip apical angle and the tip radius.

Following formation of the textured diamond films, single crystal diamond tips can be prepared by reactive etching of textured films (preferably [001] orientation) at temperatures ranging widely from room temperature to 1400° C. In terms of the reaction rate and phase purity of tips prepared, the practical range is from 600 to 1000° C.

In the fabrication method of single crystal diamond tips, direct current or/and radio-frequency bias with negative offset is preferably employed. The negative bias ranges from −20 V to −1500 V which is along with plasma potential responsible for the energy and momentum of incident ions. Therefore, it varies upon many conditions such as the method of generating plasma, the gas composition, the gas pressure and the substrate materials. The chosen bias affects the secondary electron emission and thus the plasma sheath formed in the vicinity of substrate, which is also an important factor in the deposition of the orientated diamond films.

EXAMPLE

Figure 2:
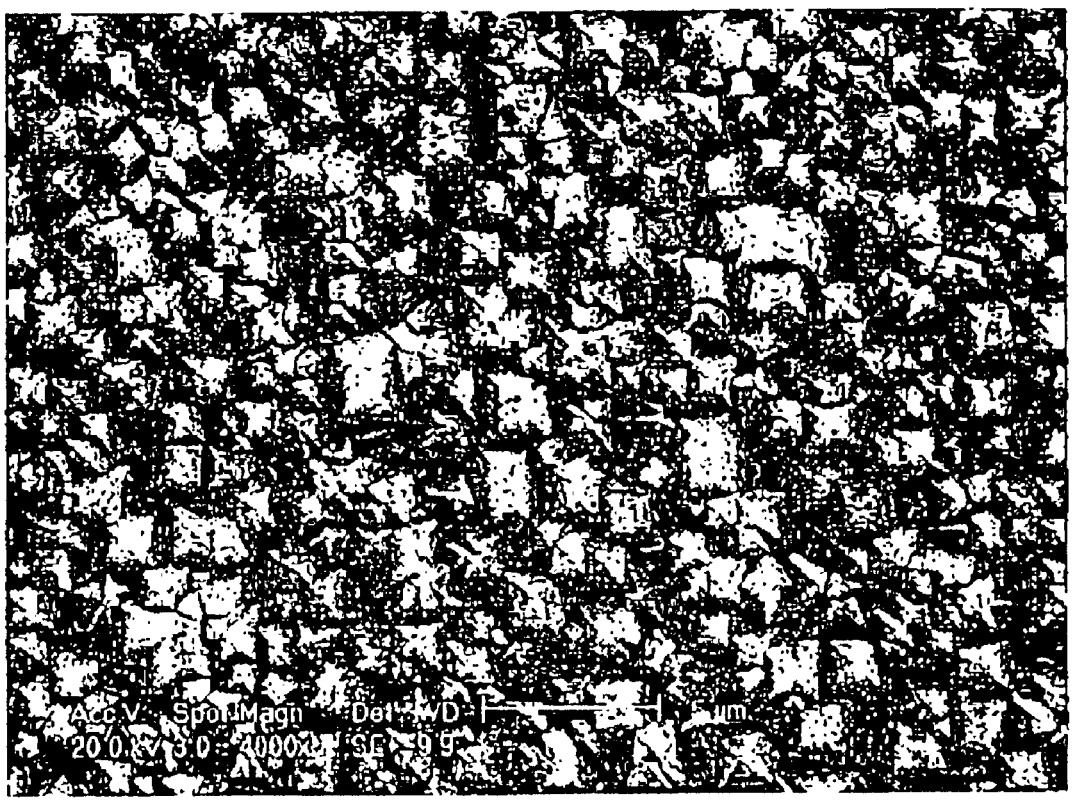
FIG. 2 is a scanning electron microscopic image of a substrate formed with a diamond film in an intermediate stage of an embodiment of the present invention.

A textured [001] pyramidal-shaped diamond film, shown in FIG. 2 which is a SEM plain-view image, with a thickness of about 5 μm was prepared by microwave plasma CVD with controlled growth parameters such as concentration of carbon precursor and temperature using the CVD apparatus shown in FIG. 1.

Figure 3:
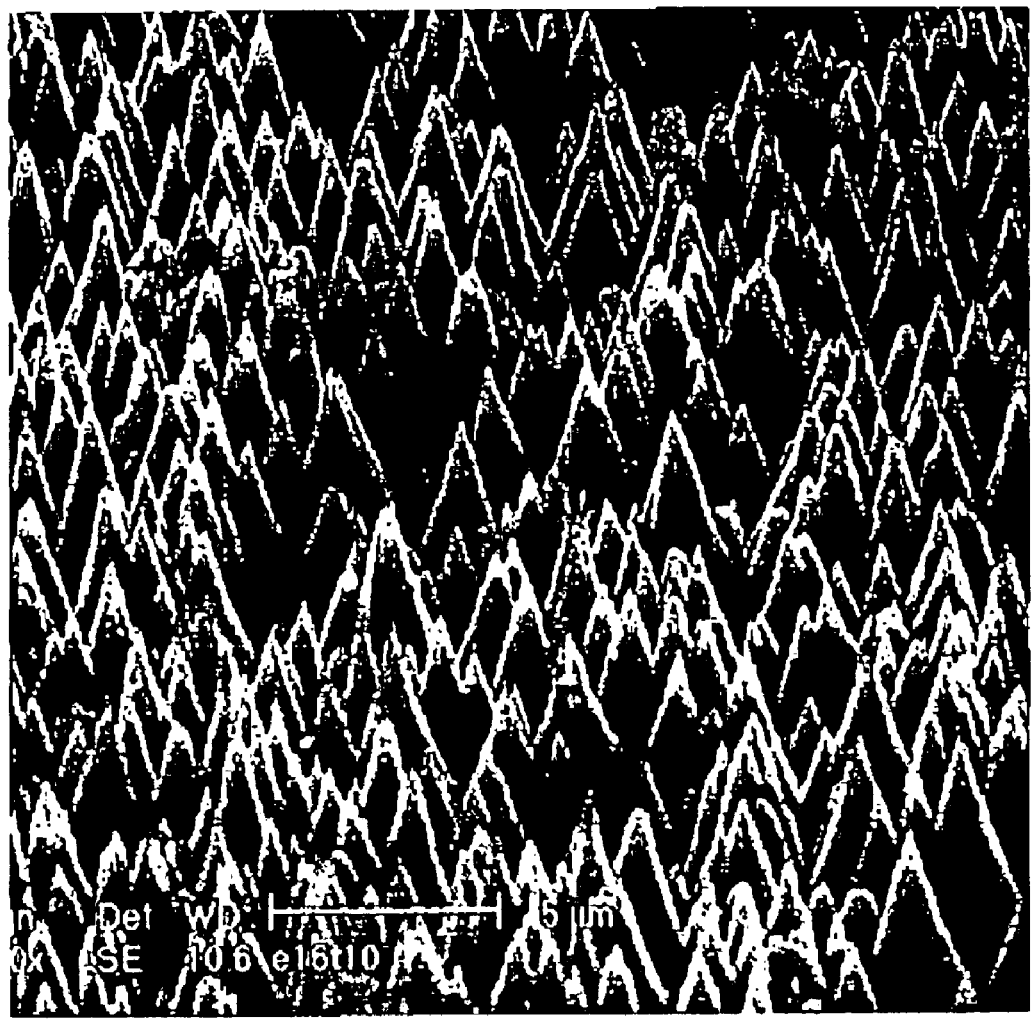
FIG. 3 is a scanning electron micrograph of an array of diamond tips formed in accordance with an embodiment of the invention.

The textured [001] pyramidal-shaped diamond film is subsequently etched in the same apparatus, but prior to etching of the oriented diamond film the reactor chamber was evacuated to $10^{-6}$ Torr by a turbo-molecular pump 5 and then hydrogen at a flow rate of 200 sccm was supplied into the chamber from a gas supply unit 6 to secure operation pressure of 40 Torr. 1500 W microwave power at 2.45 GHz supplied by a microwave generator 7 and fed via a waveguide 11 was applied to the hydrogen to form a microwave plasma. The reflected microwave power was adjusted to its minimum value, close to zero, using the impedance transformer 9. Both the forward and reflected microwave powers were constant and monitored over the entire duration of etching. In this particular case, direct current bias of −400 V, provided by a dc power supply 11, was applied to the substrate with respect to the grounded chamber. The oriented diamond film was etched at a substrate temperature of 800° C. for 40 minutes in order to obtain a tip array on the substrate as demonstrated by scanning electron microscopic (SEM) image in FIG. 3. FIG. 3 is a SEM image collected at a sample-titling angle of 45° towards the SEM detector and shows that nearly all the diamond tips have high uniformity in both tip size and aspect ratio.

Figure 4:
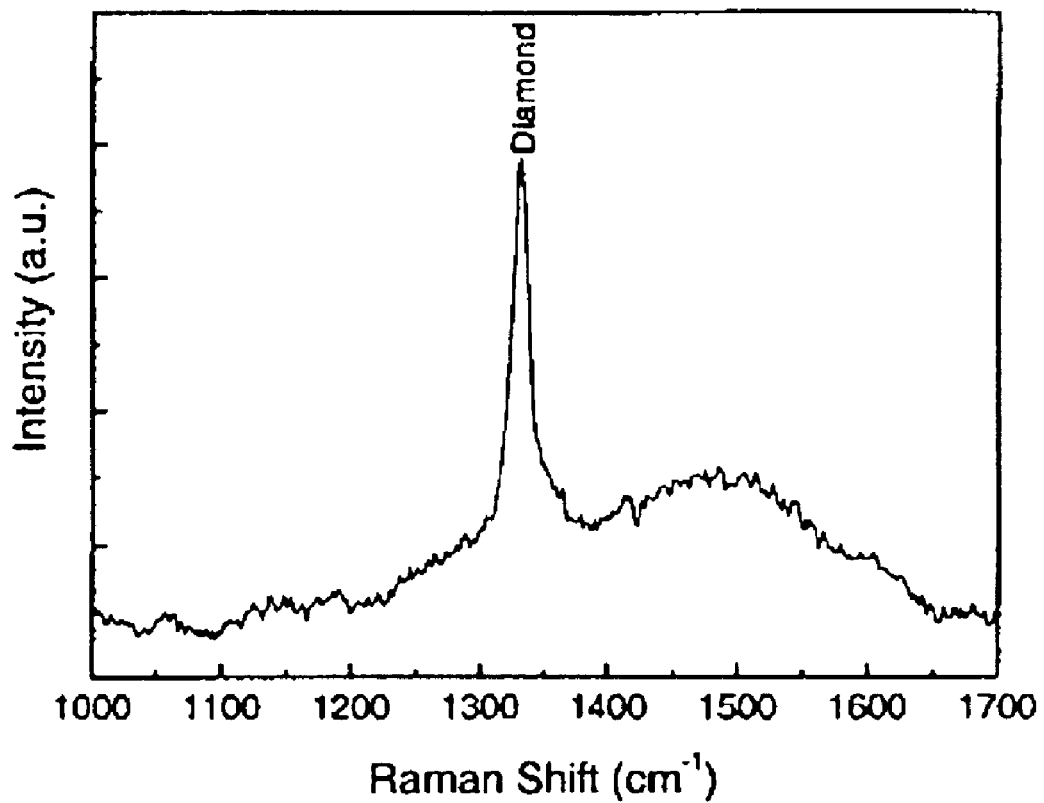
FIG. 4 illustrates the Raman spectrum obtained from the array of FIG. 3.

FIG. 4 is a graph illustrating the Raman spectrum collected from the array of diamond tips, shown in FIG. 3, using backscattering geometry and an argon ion laser with line emission at 514.5 nm. The characteristic diamond scattering mode present indicates the diamond nature of the tips. The Raman spectrum acquired from the tip array shows scattering peak at 1331 $cm^{-1}$ being the indicator of diamond. Transmission electron microscopic (TEM) observation, in FIG. 5(a), and transmission electron diffraction (TED) pattern, in FIG. 5(b), clearly show sharp diamond crystal tips with an apical angle of 28° and a tip radius of smaller than 10 nm and the single crystalline diamond structure, respectively. The TED pattern reveals {111} and {200} planes of equivalent symmetry. The orientations of these planes in the tips suggest that the tip axes are in the [001] direction of the crystal tips. The small FWHM (0.14°) of the (400) XRD rocking curve of the array of diamond tips as shown in FIG. 6 illustrates that diamond tips are highly aligned with their [001] axes parallel to each other and normal to the silicon substrate surface.

Figure 5A:
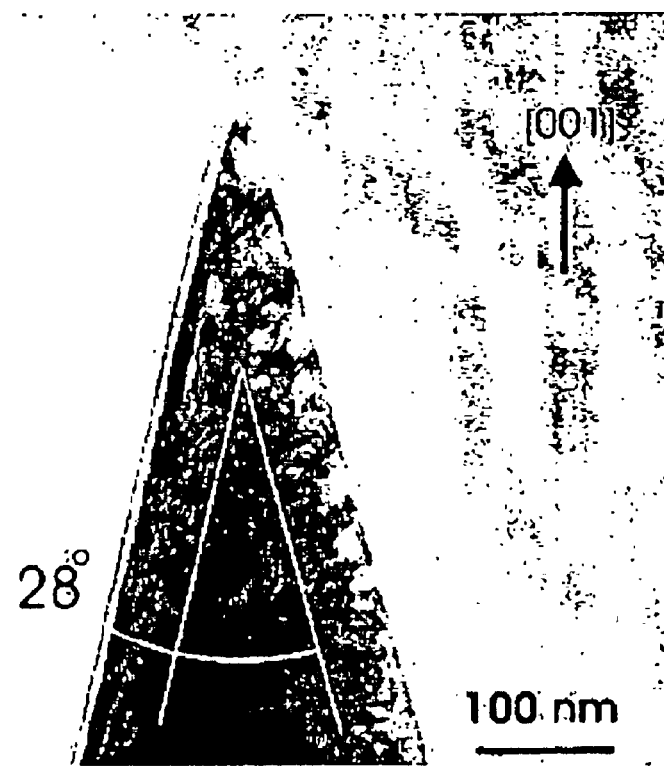
FIG. 5(a) shows a transmission electron microscopic (TEM) image and FIG. 5(b) transmission electron diffraction (TED) pattern obtained from a single tip formed in accordance with an embodiment of the invention.
Figure 5B:
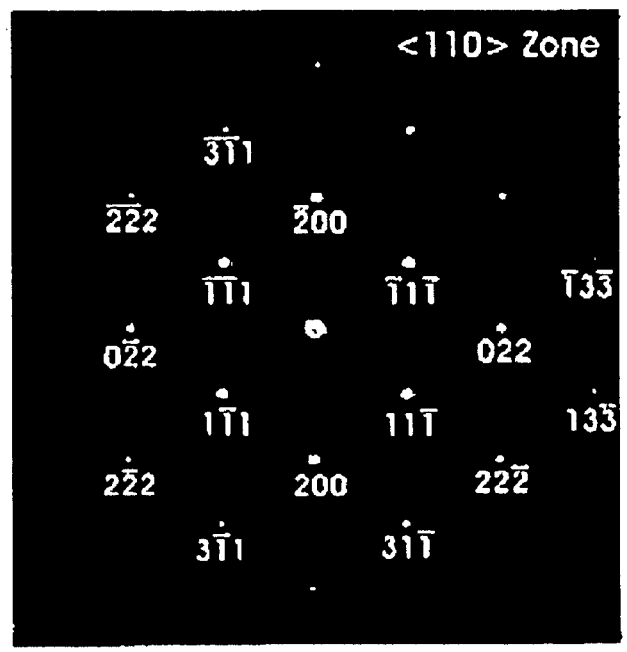
Figure 6:
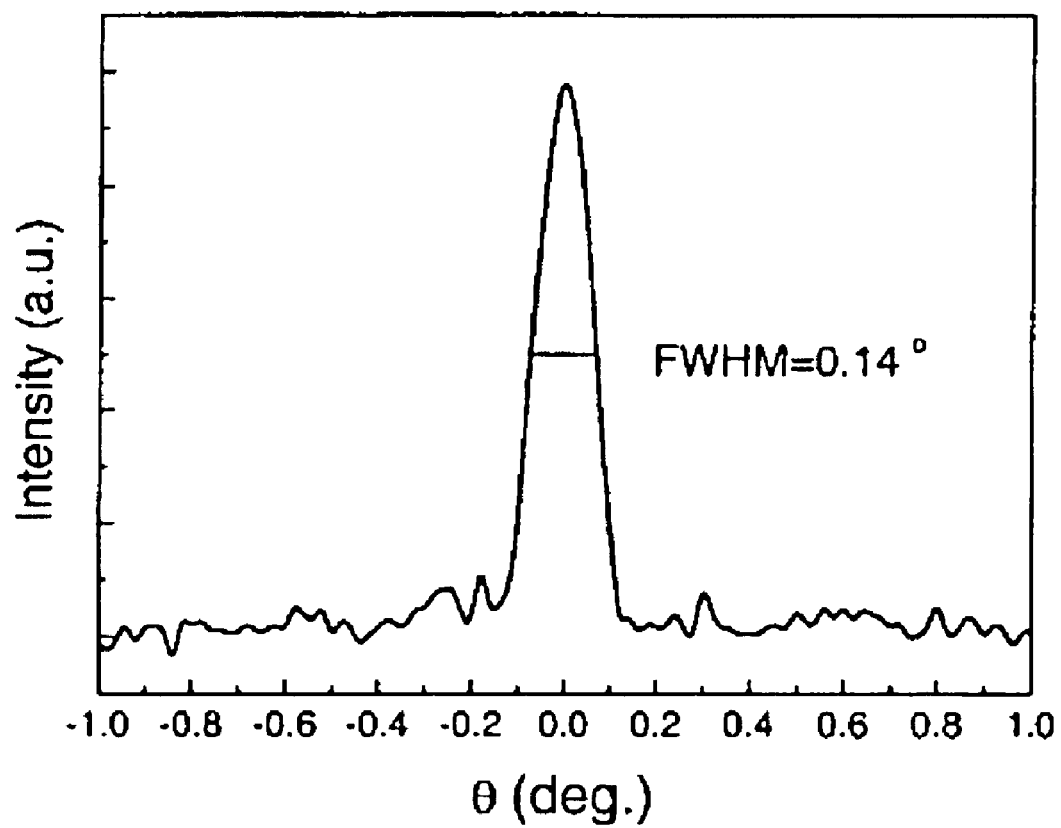
FIG. 6 is a (400) x-ray diffraction (XRD) rocking curve obtained from the array of FIG. 3

The diamond tip shown in FIG. 5(a) is uniformly covered by a thin layer (about 7 nm) of amorphous carbon film, which is caused by the ion bombardment during the fabrication process of tips. However, this amorphous layer can be removed by an easy step by performing either plasma etching, e.g. hydrogen or oxygen plasma, or by simple chemical wet etching.

Since diamond has the highest hardness, the highest thermal conductivity, and large Young's modulus, diamond tips fabricated by this invention can be used as measuring probes in high performance scanning probe microscopes (SPM) in particular atomic force microscopes (AFM) and nanoindentors. Conductive single crystal diamond tips are even suitable for the construction of measuring probes in scanning tunneling microscopes (STM). Further, the arrays of diamond tips with high-densities can also be used in field emitters and flat panel displays. The emitter arrays can be patterned either lithographically or/and selective growth.

The monocrystalline diamond tips that may be obtained using an embodiment of the present invention have potential advantages in applications such as nanoindentation and nanoscratching tests, especially in the case of measuring the surface images and tribological properties of the film materials at the same time (i.e. TriboScope applications), nanomechanics and nanomachining due to their exceptionally small tip radii and the highest hardness. The available conducting single crystal diamond tips further widen their applications in SPM including scanning tunneling microscopy (STM).

The TEM observation, TED pattern and XRD rocking curve all indicate that at least in its preferred forms the present invention provides a method for fabricating single crystal sharp diamond tips. There is further provided a gas phase method for fabricating single crystal diamond tips which can be either electrically insulating or conducting in accord with the electrical/electronic properties (intrinsic or doped) of the textured diamond films to be etched and the gas phase composition used for fabricating the diamond tips.

The present invention further provides, in its preferred forms, a reactive gas phase method for fabricating single crystal diamond tips which is carried out at substrate temperatures from room temperature to 1400° C., and wherein direct current or/and radio-frequency substrate self-bias is/are employed. In accordance with the fabrication method of the invention presented above, single crystal diamond tips with their [001] axes mutually parallel and normal to the substrate surface can be easily produced.

What is claimed is:

1. A sharp tip of monocrystalline diamond having an apical angle of no more than about 28° and a tip radius of less than about 50 nm.

2. A substrate formed with a plurality of projecting monocrystalline diamond tips, each said tip having an apical angle of no more than about 28° and a tip radius of less than about 50 nm.

3. A method of fabricating a surface provided with single crystal diamond rips, comprising the steps of:
   (a) forming diamond nuclei on a substrate,
   (b) growing a layer of textured diamond film on said substrate, and
   (c) etching said textured diamond film.

4. A method as claimed in claim 3 wherein in step (a) wherein said diamond nuclei are fanned with a (100) orientation.

5. A method as claimed in claim 3 wherein said step (a) comprises bias-enhanced nucleation.

6. A method as claimed in claim 3 wherein said step (a) comprises pre-scratching the substrate prior to nucleation.

7. A method as claimed in claim 3 wherein said substrate is selected from the group consisting of mirror-polished silicon, silicon carbide, quartz, sapphire, platinum and iridium.

8. A method as claimed in claim 3 wherein said step (b) comprises a chemical vapour deposition process.

9. A method as claimed in claim 3 wherein said step (b) comprises growing said layer with a (001) orientation.

10. A method as claimed in claim 3 wherein said step (b) comprises controlling the alpha parameter during growth.

11. A method as claimed in claim 3 wherein said step (b) further comprises doping said layer of diamond film.

12. A method as claimed in claim 11 wherein said doping is performed by introducing a boron-containing, sulfur-containing or phosphorous-containing gas in the deposition of the diamond film.

13. A method as claimed in claim 12 wherein the boron-containing gas is selected from the group consisting of: boron hydrides, boron halides, borohydrides, borofluorides or organic boron compounds.

14. A method as claimed in claim 3 wherein said step (c) comprises etching by means of a hydrogen-based plasma.

15. A method as claimed in claim 14 wherein a negative-bias is applied to the substrate during said etching process.

16. A method as claimed in claim 14 wherein said step (c) further comprises doping said tips.

17. A method as claimed in claim 14 wherein said doping is carried out by introducing a boron-containing, sulfur-containing or phosphorous-containing gas during said etching process.

18. A method as claimed in claim 17 wherein the boron-containing gas is selected from the group consisting of: boron hydrides, boron halides, barohydrides, borofluorides or organic boron compounds.

19. A method as claimed in claim 14 further comprising adding an inert gas to the hydrogen-based plasma to control the plasma.

20. A method of fabricating a surface provided with single crystal diamond tips, comprising the steps of:
  (a) forming diamond nuclei on a substrate by bias-enhanced nucleation,
  (b) growing a layer of textured diamond film on said substrate, and
  (c) etching said textured diamond film.

21. A method of fabricating a surface provided with single crystal diamond tips, comprising the steps of:
  (a) pre-scratching a substrate and then forming diamond nuclei on the substrate,
  (b) growing a layer of textured diamond film on said substrate, and
  (c) etching said textured diamond film.

22. A method of fabricating a surface provided with single crystal diamond tips, comprising the steps of:
  (a) forming diamond nuclei on a substrate,
  (b) growing a layer of textured diamond film with a (001) orientation on said substrate, and
  (c) etching said textured diamond film.

23. A method of fabricating a surface provided with single crystal diamond tips, comprising the steps of:
  (a) forming diamond nuclei on a substrate,
  (b) growing a layer of textured diamond rum on said substrate while controlling the alpha parameter, and
  (c) etching said textured diamond film.

24. A method of fabricating a surface provided with single crystal diamond tips, comprising the steps of:
  (a) forming diamond nuclei on a substrate,
  (b) growing a layer of textured diamond film on said substrate, and
  (c) etching said textured diamond film by means of a hydrogen-based plasma.

25. A method as claimed in claim 24 wherein a negative-bias is applied to the substrate during said etching process.

26. A method as claimed in claim 24 wherein said step (c) further comprises doping said tips.

27. A method as claimed in claim 26 wherein said doping is carried out by introducing a boron-containing, sulfur-containing or phosphorous-containing gas during said etching process.

28. A method as claimed in claim 27 wherein the boron-containing gas is selected from the group consisting of: boron hydrides, boron halides, borohydrides, borofluorides or organic boron compounds.

29. A method as claimed in claim 24 further comprising adding an inert gas to the hydrogen-based plasma to control the plasma.

* * * * *